United States Patent [19]

Quiogue

[11] Patent Number: 4,712,162
[45] Date of Patent: Dec. 8, 1987

[54] CAPACITOR HOLD-DOWN STRAP

[75] Inventor: Honesto D. Quiogue, Blacksburg, Va.

[73] Assignee: Hubbell Incorporated, Orange, Conn.

[21] Appl. No.: 937,702

[22] Filed: Dec. 4, 1986

[51] Int. Cl.$^4$ .............................................. H05K 7/02
[52] U.S. Cl. .................................... 361/417; 224/250;
248/505; 248/510; 361/419; 410/96
[58] Field of Search .................. 24/301; 180/68.5;
224/318, 250, 902, 909; 248/74.3, 231, 505, 510;
280/5 H, 5 R, 5 A; 361/271, 400, 417–420, 427;
410/2, 96–97, 117

[56] References Cited

U.S. PATENT DOCUMENTS

| 1,071,557 | 8/1913 | Kells | 180/68.5 |
| 1,519,854 | 1/1924 | Lockwood | 24/300 |
| 2,376,336 | 5/1945 | Brown | 280/5 |
| 3,313,511 | 4/1967 | Koerner et al. | 248/361 |
| 3,340,603 | 9/1967 | Charles | 29/592 |
| 3,369,784 | 2/1968 | Whitney | 248/505 |
| 3,721,374 | 3/1973 | Eby | 224/318 |
| 4,133,080 | 1/1979 | Kuk | 24/73 |
| 4,367,572 | 1/1983 | Zielenski | 24/301 |
| 4,396,138 | 8/1983 | Kirschner | 224/318 |
| 4,565,256 | 1/1986 | Valdez | 180/68.5 |

FOREIGN PATENT DOCUMENTS

| 0239222 | 6/1962 | Australia | 361/400 |
| 1363881 | 12/1964 | France | 224/318 |
| 0697385 | 9/1953 | United Kingdom | 248/505 |
| 0835191 | 5/1960 | United Kingdom | 248/505 |
| 0894142 | 4/1962 | United Kingdom | 248/505 |

Primary Examiner—G. P. Tolin
Assistant Examiner—Greg Thompson
Attorney, Agent, or Firm—Jerry M. Presson; Walter C. Farley

[57] ABSTRACT

A resilient hold-down strap for retaining one or more capacitors in position against a housing wall includes substantially rigid end brackets integrally attached to an intermediate strap portion which is elastically extensible. Thickened ends of the intermediate strap portions are securely attached to the end brackets, or unitarily formed therewith, to form a unitary strap member. Holes are provided in the end brackets for fasteners to pass into or through the housing wall so that the capacitor is positioned securely between the fastener locations.

2 Claims, 11 Drawing Figures

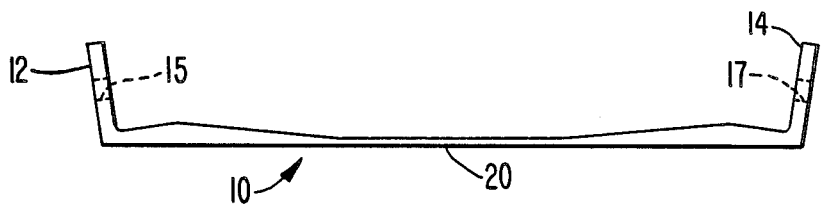
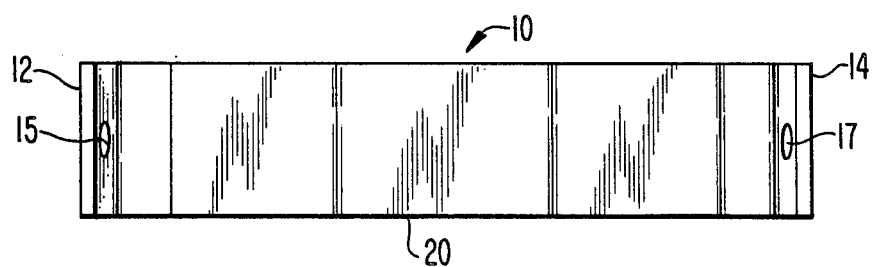
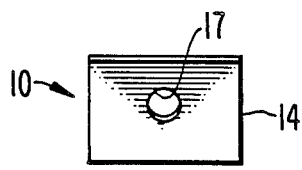
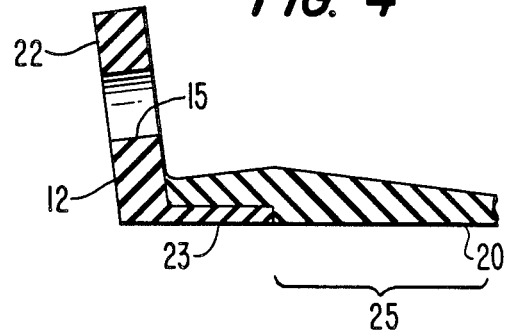
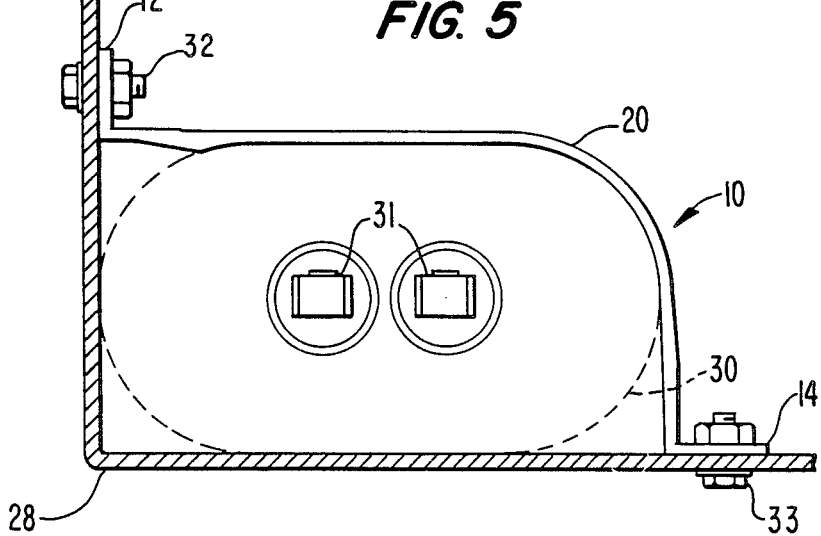

CAPACITOR HOLD-DOWN STRAP

This invention relates to a stretchable strap for holding a capacitor in its proper mounting position in a high intensity discharge lamp housing.

BACKGROUND OF THE INVENTION

Recent advances in high intensity discharge lamp technology are creating a material inventory problem for lighting fixture manufacturers. There are three popular high intensity discharge (HID) lamp types today, mercury vapor, metal halide and high pressure sodium. These lamps are available in various wattage sizes including 35, 50, 70, 75, 100, 150, 175 and others up to 1500 watts. In addition, these types and sizes are made to operate at various voltages including 120 volts, 208 volts, 240 volts, 277 volts, and 480 volts.

Each of these types of lamps requires a ballast in order to operate properly. Each ballast circuit includes a capacitor for efficient and economical operation. This capacitor, or capacitors in some cases, determines the amount of power delivered to the lamp. If more capacitance than that specified is used, the lamp will be forced to operate at a higher wattage than normal. If the capacitance used is lower than the correct value, the lamp will operate at a reduced wattage. Either condition can be harmful to the lamp or the ballast or both. It is therefore imperative for a lighting fixture manufacturer to deal with the numerous variations in types, wattages, and voltages by stocking a variety of capacitor sizes. In this sense, capacitor size is used to refer to electrical size, but, as is well known, capacitors which are made with different values of capacitance and for use with different voltages also usually exhibit different physical sizes as well.

The most popular capacitors used by the lighting industry are packaged in oval cans of which there are several sizes. Commonly, a capacitor is constructed by winding a polypropylene insulator film with a metalized aluminum film to act as an electrode, connecting the appropriate portions together and placing this assembly inside a deep-drawn oval can which is then filled with oil and hermetically sealed. The resulting article can be rather bulky, in sizes usable in lighting circuits. A typical 14 microfarad capacitor rated for 240 volts has a width of 3 7/16 inches, a thickness of 2¼ inches, a height of 4¼ inches and a weight of 6½ lbs. It is quite important that this capacitor be held firmly in place, but it must not be held too tightly because compressive forces on the exterior of the can can cause oil leakage or physical damage to the can which can also involve electrical damage to the capacitor.

When installed in lighting fixtures, a capacitor must be held in place in any of a variety of mounting surfaces and conditions. Typical situations involve either a cast housing or a sheet metal panel against which the capacitor is to be held. Normally, the housing is provided with two fastener devices which are spaced apart to form a gap between which the capacitor is to be mounted. However, In any one type of housing, a variety of different capacitor sizes may be usable, depending upon the ballast and lamp sizes which are to be installed in that housing. Thus, a variety of clamping brackets are required.

In order to try to minimize the number of different types of clamping brackets which must be produced and stocked in inventory, various techniques have been employed. One example is the use of a metal strip with a series of perforations down the center of the strip. When using this kind of material, a portion of the strip is cut to approximate the length that will reach around the largest capacitor can from one fastener to the other. Depending on the size of the can, the installer will select the combination of two holes in the strip which will most satisfactorily hold the capacitor in place. Obviously, this method rarely if ever will provide a combination of holes which, upon tightening the bolts, will provide the precise length of strap necessary to hold the capacitor without denting the capacitor can. As a practical matter, this method has done more damage than good.

SUMMARY OF THE INVENTION

Accordingly, an object of the present invention is to provide a capacitor hold-down strap which is capable of firmly securing a capacitor in its mounting location between fasteners without inflicting damage upon the capacitor housing.

A further object is to provide such a strap which can be used universally for a variety of sizes and shapes of capacitors.

Briefly described, the invention includes a capacitor hold-down strap for use in combination with a mounting surface against which a capacitor is to be held and fastener means attached to the mounting surface at spaced locations between which the capacitor is to be held, the strap comprising first and second L-shaped end brackets each having a hole through one leg of the L-shape for receiving one of the fastener means, each of the end brackets being substantially rigid and non-resilient. An intermediate strap portion extends between the end brackets for partially encompassing a capacitor positioned between the fastener means, each end of the strap portion being integrally and nondetachably connected to the other leg of the L-shape. The strap portion includes end regions adjacent the end brackets having a thickness greater than the thickness of the other leg and being resilient, and a central region having a thickness less than the thickness of the end regions and being significantly more elastic than the end regions for elastically engaging and holding the capacitor against the surface.

Preferably, the width of the strap portion and the end brackets is substantially uniform.

BRIEF DESCRIPTION OF THE DRAWINGS

In order to impart full understanding of the manner in which these and other objectives are obtained in accordance with the invention, particularly advantageous embodiments thereof will be described with reference to the accompanying drawings, which form a part of this specification and wherein:

FIG. 1 is a side elevation of a hold-down strap in accordance with the invention;

FIG. 2 is a top plan view of the hold-down strap of FIG. 1;

FIG. 3 is an end elevation of the strap of FIGS. 1 and 2;

FIG. 4 is an enlarged partial sectional view of one end of the strap of FIGS. 1–3;

FIGS. 5 and 6 are two examples of capacitors being held on mounting plates by a hold-down strap in accordance with the present invention;

DESCRIPTION OF THE PREFERRED EMBODIMENTS

Figure 6:
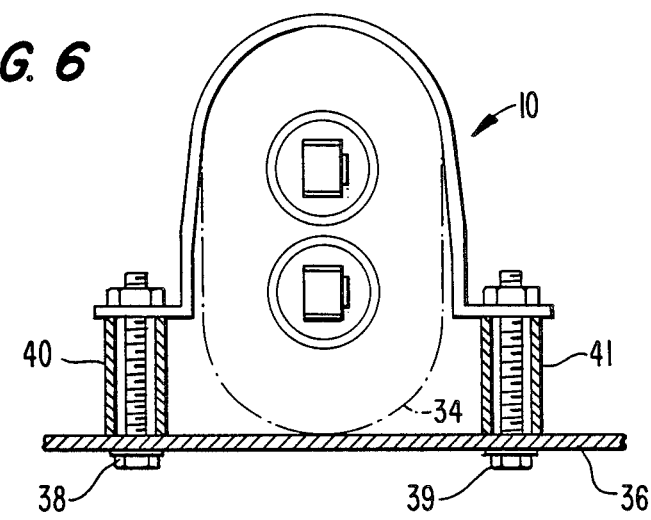

FIGS. 1-3 show side, top and end views of a hold-down strap indicated generally at 10 in accordance with the invention wherein the strap includes first and second L-shaped end brackets 12 and 14. Bracket 12 is provided with a hole 15 and bracket 14 is provided with a hole 17 through which fasteners can be passed.

Between end brackets 12 and 14 is an intermediate strap portion 20 which is integrally attached at both ends to the end brackets.

Each of brackets 12 and 14 is made of a material which is substantially rigid and non-resilient. The end brackets are intended to remain stiff and to retain the shape shown in the drawings under conditions of normal use. The intermediate strap portion 20, however, is a resilient, elastic member which is made of a different material from end brackets 12 and 14 and which has sufficient resilience to permit significant elastic deformation under normal conditions of use. As best seen in FIGS. 1 and 4, end bracket 12 is generally L-shaped and has an upstanding leg 22 and a generally horizontal leg 23 in the position shown in the figures. The angle between legs 22 and 23 is preferably greater than 90°, the specific embodiment shown having an angle of about 98°. Bracket 14 is the same. Brackets 12 and 14 are preferably extruded using a hard elastomer such as an ethylene propylene diene monomer (EPDM) in accordance with ASTM D-2000, MBC-407, exhibiting a durometer shore hardness of approximately 40. Intermediate strap 20 is made from a soft EPDM having a durometer shore hardness of about 50.

It will also be observed that the ends of intermediate strap portion 20 are thickened in a particular way to alter the elasticity characteristics thereof. In particular, as seen in FIG. 4, a region 25 adjacent the junction point with the end bracket is not only thicker than the end bracket itself but also thicker than the remainder of the intermediate strap portion. This increased thickness reduces the elasticity in that region as compared with the central portion although it remains, of course, significantly more resilient than the end bracket.

A strap in accordance with FIGS. 1-4 can be produced by molding the end brackets, separately molding the intermediate strap portion and then joining the two members together by vulcanization.

Another manufacturing technique is to mold end brackets 12 and 14 and transfer those brackets, partially cured, into a different mold having a suitable cavity for forming the intermediate strap portion. Thus, in this process, the intermediate strap portion is injection-molded directly onto the end brackets and becomes a securely attached, integral portion thereof.

A further and preferred technique is to produce the structure using a dual extrusion technique in which the end portions forming the brackets are produced from an EPDM composition different from the central portion, the intermediate regions constituting transition areas in which the degree of elasticity changes in the manner of a gradient between substantially non-elastic to the elasticity necessary for the central strap portion.

In this technique, an extrusion die is provided which has an opening resembling the shape of the strap as shown in FIG. 1. The extruder feed leading to the end bracket portions of the strap are supplied with an elastomer capable of being cured to a hard solid and the intermediate strap portion is supplied with an elastomer which cures to form an elastic strap. The extruded strip is cut and cured.

While various elastomers are usable, it has been found that an excellent end product is obtained using EPDM (ethylene propylene diene monomer) for both portions, the hard end portions being adjusted so that, when cured, they satisfy ASTM D-2000, MBC-407, with a Shore D hardness of 40 10, have 25% ±minimum original elongation and meet the UL 94 V-2 test. The soft material satisfies ASTM D-2000, M2BC-507 and also meets UL 94 V-2.

FIGS. 5-8 illustrate the various ways in which a hold-down strap in accordance with the invention can be advantageously employed. As indicated above, there are two primary kinds of housings to which a capacitor is to be attached for use in connection with a ballast for an HID lamp. FIGS. 5 and 6 illustrate the kind of housing which is formed of sheet metal or the like which, in FIG. 5, has walls 28. In this particular configuration, a capacitor 30 having insulated electrical terminals 31 for connection to the lighting fixture circuit is to be mounted adjacent walls 28 in a corner of a housing. The walls are provided with openings to receive fasteners 32 and 33 which constitute machine screws and nuts. End brackets 12 and 14 are attached to the walls by passing the machines screws through openings 15 and 17 and tightening the fastener nuts. The positions of the openings for fasteners 32 and 33 are selected so that some stretching of intermediate strap portion 20 occurs.

FIG. 6 shows a somewhat similar capacitor 34 attached to a panel 36 using a hold-down strap 10 and fasteners 38 and 39. In this case, the arrangement of components dictates that the capacitor must be positioned with its narrow edge in contact with panel 36. Accordingly, cylindrical spacers 40 and 41 are positioned around longer fasteners so that strap 10 can tightly encompass the upper region of the capacitor.

Figure 7:
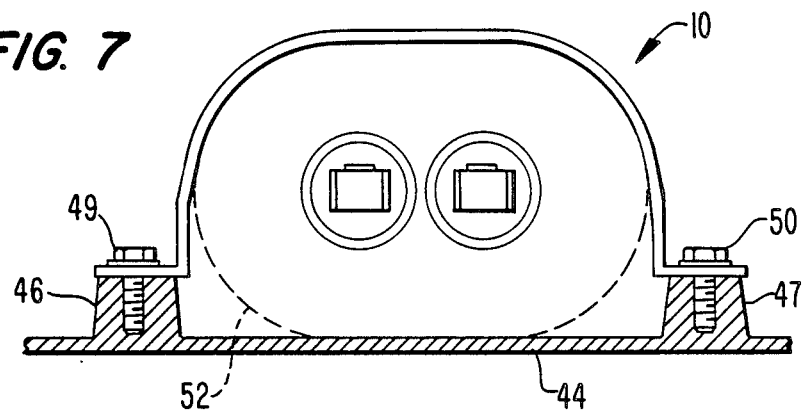
FIGS. 7 and 8 are examples of capacitors being held in position in a cast housing using a hold-down strap in accordance with the invention.
Figure 8:
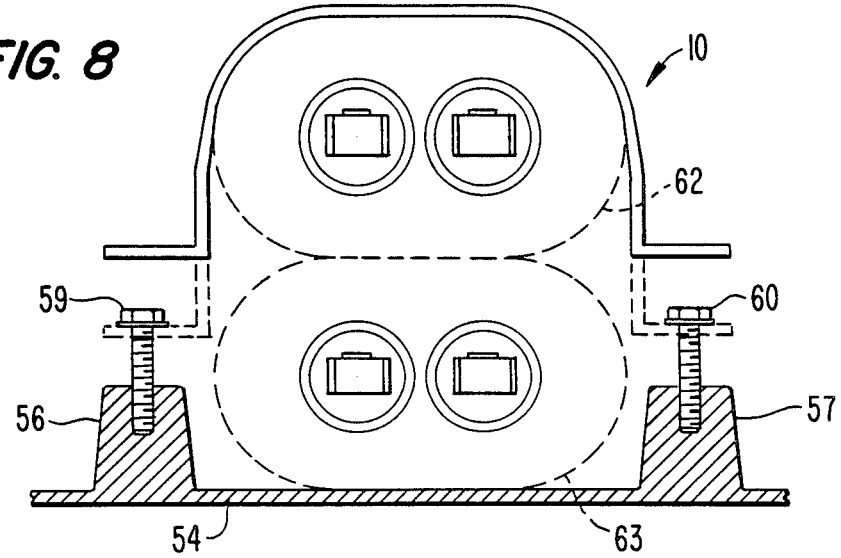

FIGS. 7 and 8 illustrate the hold-down strap in connection with a cast housing in which internally threaded holes are provided in bosses to receive fasteners. In FIG. 7, a cast housing 44 is provided with bosses 46 and 47 which have internally threaded holes to receive machine screws 49 and 50. A strap 10 is passed over the top of a capacitor 52 which is lying on its side between the two fastener means.

It will also be recognized, of course, that any of the panels or cast wall members illustrated can occupy any orientation and need not be in a horizontal position as might be suggested by the drawings.

FIG. 8 shows a portion of a cast housing 54 with bosses 56 and 57 having internally threaded holes to receive machine screws 59 and 60. A strap 10 passes over the top of two capacitors 62 and 63 such that the machine screws pass through the opening in the end brackets. FIG. 8 further illustrates the two positions of the strap, the solid line position showing the strap as it is simply draped over the top of the capacitors with no elastic extension. The dotted lines illustrate the positions of the end brackets after the machine screws have been placed therethrough and fully threaded into the boss openings, causing the elastic deformation which provides the force to retain the capacitors in position.

Figure 9:
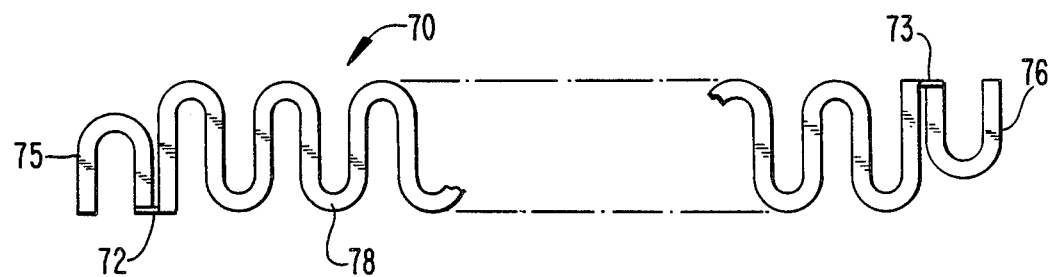
FIG. 9 is a top plan view of an alternative embodiment of a hold-down strap in accordance with the invention.
Figure 10:
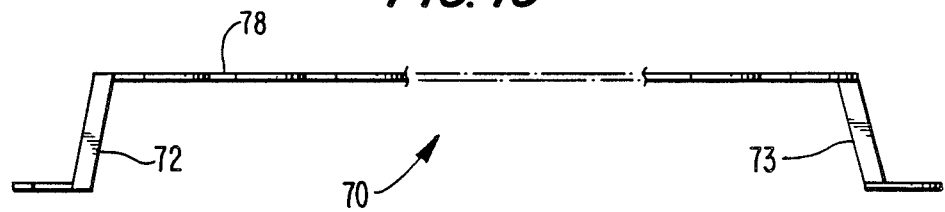
FIGS. 10 and 11 are a side elevation and an end elevation, respectively, of the strap of FIG. 9.
Figure 11:
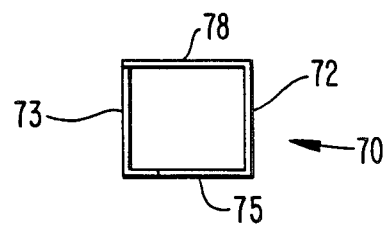

FIGS. 9-11 illustrate a possible alternative embodiment using spring steel rather than a rubber-like material. As shown therein the hold-down strap indicated generally at 70 includes end brackets 72 and 73 which are generally L-shaped in elevation, the lower legs of the brackets having open-sided loops 75 and 76 which can be placed around fasteners such as 59 and 60 in FIG. 8 to keep the strap in place.

Between the end brackets is a sinuous flat spring 78 which is flexible and elastic and which can be placed around the body of a capacitor to hold it in place. As will be recognized, the material of spring 78 does not elongate significantly. Rather, the elongation of the overall spring is achieved by elastic bending of the oppositely directed loops. Thus, it is possible to make the entire strap 70 of the same material and the ends will be relatively stiff while the strap portion is quite elastic.

While certain advantageous embodiments have been chosen to illustrate the invention, it will be understood by those skilled in the art that various changes and modifications can be made therein without departing from the scope of the invention as defined in the appended claims.

What is claimed is:

1. A capacitor hold-down strap in combination with a mounting surface against which a capacitor is to be held and fastener means attached to the mounting surface at two spaced locations between which the capacitor is to be held, the strap comprising first and seocnd L-shaped end brackets, each said bracket having two legs and means defining an opening in one leg thereof for receiving said fastener means, said one leg being substantially flat and said opening passing therethrough perpendicular to the plane containing said one leg, each of said end brackets being substantially rigid and non-resilient; and and intermediate flexible and elastic elongatable strap portion extending between said end brackets for partially encompassing a capacitor positioned between said fastener means, each end of said strap portion being integrally and non-detachably connected to the other leg of one of said end brackets for elastically engaging and holding said capacitor against said surface, said intermediate strap portion comprising an elongated band of spring steel shaped to lie along a sinuous path and contained in a single plane.

2. A capacitor hold-down strap in combination with a mounting surface against which a capacitor is to be held and fastener means attached to the mounting surface at two spaced locations between which the capacitor is to be held, the strap comprising first and second L-shaped end brackets each having a hole through one leg of the L shape for receiving said fastener means, each of said brackets being substantially rigid and non-resilient; and an intermediate flexible and elastic strap portion of substantially constant width extending between said end brackets for partially encompassing a capacitor positioned between said fastener means, each end of said strap portion being integrally and non-detachably connected to the other leg of one of said end brackets, said intermediate strap portion including end regions adjacent said end brackets having a thickness greater than the thickness of said other leg and being elastic, and a central region having a thickness less than the thickness of said end regions and being significantly more elastic than said end regions for elastically engaging and holding said capacitor against said surface.

* * * * *